(12) United States Patent
Adam et al.

(10) Patent No.: US 9,053,939 B2
(45) Date of Patent: Jun. 9, 2015

(54) HETEROJUNCTION BIPOLAR TRANSISTOR WITH EPITAXIAL EMITTER STACK TO IMPROVE VERTICAL SCALING

(75) Inventors: Thomas N. Adam, Slingerlands, NY (US); David L. Harame, Essex Junction, VT (US); Qizhi Liu, Lexington, MA (US); Alexander Reznicek, Mount Kisco, NY (US)

(73) Assignee: International Business Machines Corporation, Armonk, NY (US)

(*) Notice: Subject to any disclaimer, the term of this patent is extended or adjusted under 35 U.S.C. 154(b) by 742 days.

(21) Appl. No.: 13/303,248

(22) Filed: Nov. 23, 2011

(65) Prior Publication Data
US 2013/0126944 A1    May 23, 2013

(51) Int. Cl.
| | | |
|---|---|---|
| H01L 29/737 | (2006.01) | |
| H01L 21/02 | (2006.01) | |
| H01L 29/66 | (2006.01) | |
| H01L 29/08 | (2006.01) | |
| H01L 29/417 | (2006.01) | |
| H01L 29/10 | (2006.01) | |

(52) U.S. Cl.
CPC ....... *H01L 21/0262* (2013.01); *H01L 29/41708* (2013.01); *H01L 29/66242* (2013.01); *H01L 29/7371* (2013.01); *H01L 29/0817* (2013.01); *H01L 29/1004* (2013.01); *H01L 21/02381* (2013.01); *H01L 21/02439* (2013.01); *H01L 21/02447* (2013.01); *H01L 21/0245* (2013.01); *H01L 21/02521* (2013.01); *H01L 21/02529* (2013.01); *H01L 21/02532* (2013.01); *H01L 21/02576* (2013.01); *H01L 21/02579* (2013.01)

(58) Field of Classification Search
None
See application file for complete search history.

(56) References Cited

U.S. PATENT DOCUMENTS

| | | | |
|---|---|---|---|
| 5,227,329 A | 7/1993 | Kobayashi et al. | |
| 5,266,504 A | 11/1993 | Blouse et al. | |
| 5,316,958 A | 5/1994 | Meyerson | |
| 5,773,340 A | 6/1998 | Kumauchi et al. | |
| 6,180,478 B1 | 1/2001 | Lee et al. | |
| 7,049,681 B2 | 5/2006 | Ohnishi et al. | |
| 7,378,324 B2 * | 5/2008 | Adam et al. | 438/350 |
| 7,897,495 B2 | 3/2011 | Ye et al. | |
| 2006/0071239 A1 * | 4/2006 | Saito et al. | 257/192 |
| 2006/0115934 A1 | 6/2006 | Kim et al. | |
| 2007/0051980 A1 | 3/2007 | Hodge et al. | |

* cited by examiner

*Primary Examiner* — Wensing Kuo
(74) *Attorney, Agent, or Firm* — Gibb & Riley, LLC; Michael J. LeStrange, Esq.

(57) ABSTRACT

A heterojunction bipolar transistor (HBT) may include an n-type doped crystalline collector formed in an upper portion of a crystalline silicon substrate layer; a p-type doped crystalline $p^+Si_{1-x}Ge_x$ layer, formed above the n-type doped collector, that forms a p-type doped internal base of the HBT; a crystalline silicon cap formed on the p-type doped crystalline $p^+Si_{1-x}Ge_x$ layer, in which the crystalline silicon cap includes an n-type impurity and forms an n-type doped emitter of the HBT; and an n-type doped crystalline silicon emitter stack formed within an opening through an insulating layer to an upper surface of the crystalline silicon cap.

18 Claims, 5 Drawing Sheets

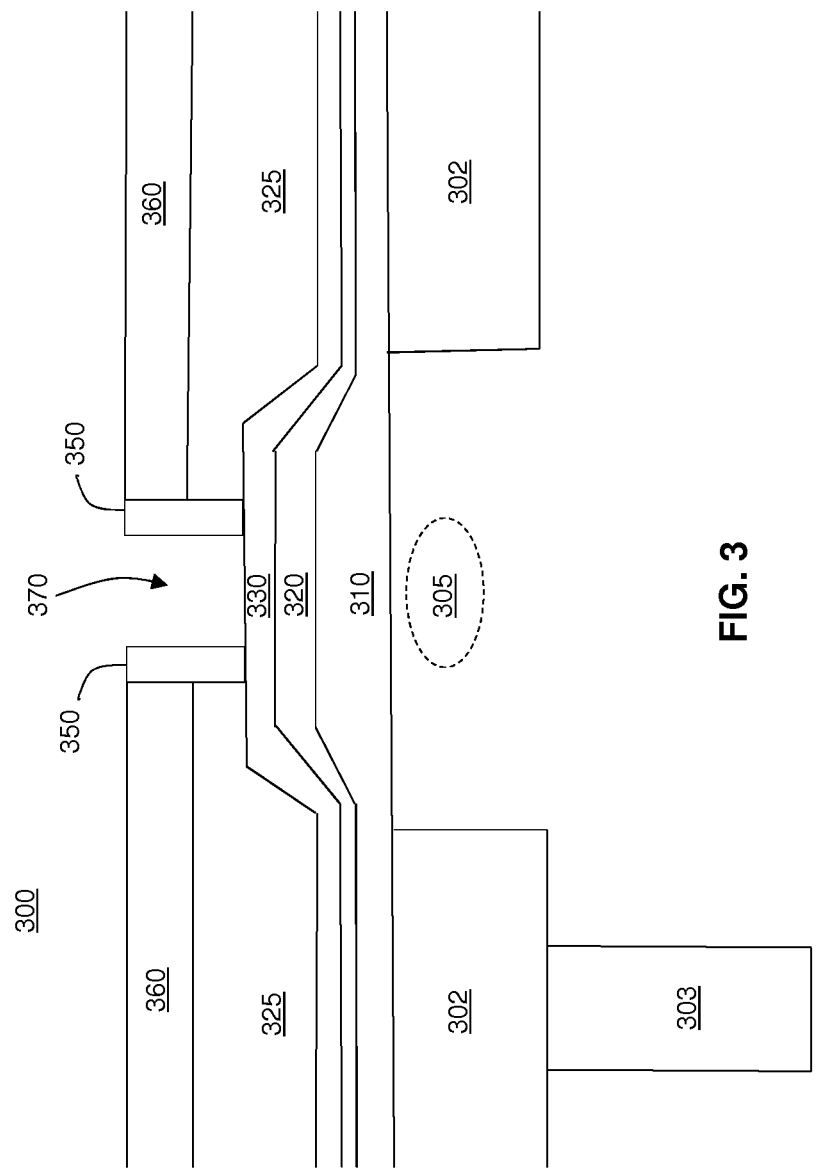

HETEROJUNCTION BIPOLAR TRANSISTOR WITH EPITAXIAL EMITTER STACK TO IMPROVE VERTICAL SCALING

BACKGROUND

1. Field of the Invention

The exemplary embodiments generally relate to a structure and method of making a heterojunction bipolar transistor (HBT) including an n-type doped crystalline silicon emitter stack that is formed upon a crystalline silicon cap, into which the n-type dopant from the emitter stack has diffused during its formation to form the n-type doped emitter of the HBT. More specifically, formation of the n-type doped crystalline silicon emitter stack on the crystalline silicon cap improves vertical scaling, by reducing the height of emitter structures, for HBTs of 130 nm node technology and beyond.

2. Description of Related Art

A heterojunction bipolar transistor (HBT) is a bipolar transistor that is formed on a crystalline silicon (Si) substrate, which includes a heterojunction, such as silicon/silicon germanium (Si/SiGe), to provide superior conduction for operation at high frequencies. This type of HBT uses a Si/SiGe heterojunction formed by epitaxially growing a crystalline SiGe layer on the crystalline Si substrate. Since the crystalline Si substrate and crystalline SiGe layer are made of materials that are compatible with conventional photolithography processes, the HBT can be made at low cost with high yields. A Si/Si$_{1-x}$Ge$_x$ HBT also offers the ability to continuously adjust the bandgap of the heterojunction because Si and Ge are solid-soluble in each other to substantially any percentage.

FIG. 1 is a cross-sectional view illustrating a conventional npn-type, SiGe HBT 100. A collector 105 is formed within an upper portion of a crystalline silicon substrate layer that is disposed between device-isolating shallow trench isolators 102 and a deep trench 103. The crystalline silicon substrate layer is grown epitaxially and an n-type impurity, such as phosphorus (P), is introduced into an upper portion of the crystalline silicon substrate layer during epitaxial growth or by ion implantation to form an n-type doped silicon crystal, as the n-type crystalline collector 105 of the HBT. A crystalline Si$_{1-x}$Ge$_x$ layer, including an undoped i-Si$_{1-x}$Ge$_x$ layer 110 and p-type doped p$^+$Si$_{1-x}$Ge$_x$ layer 120, is formed over the n-type crystalline collector 105. The undoped i-Si$_{1-x}$Ge$_x$ layer 110 is epitaxially grown by an admixture of a silicon-containing gas, such as silane (SiH$_4$) or disilane (Si$_2$H$_6$), and a germanium-containing gas, such as germane (GeH$_4$) or digermane (Ge$_2$H$_6$), respectively. Another gas, for example, borane (B$_2$H$_6$), containing the p-type impurity, boron (B), is added to silicon-containing and germanium-containing gases, to epitaxially grow the p-type doped crystalline p$^+$Si$_{1-x}$Ge$_x$ layer 120 on the undoped i-Si$_{1-x}$Ge$_x$ layer 110. The p-type doped crystalline p$^+$Si$_{1-x}$Ge$_x$ layer 120, which mainly forms an internal base of the HBT, is electrically connected to an external base layer 125. An undoped crystalline silicon cap 130 is then epitaxially grown over the p-type doped crystalline p$^+$Si$_{1-x}$Ge$_x$ layer 120. Together, the undoped crystalline silicon cap 130, and the p-type doped and undoped crystalline Si$_{1-x}$Ge$_x$ layers 120, 110 form a Si/Si$_{1-x}$Ge$_x$ heterojunction.

Referring to FIG. 1, an emitter opening is formed above a central portion of the undoped silicon cap 130, through an external base layer 125 and an insulating layer 160, by processes well known in the art. The emitter opening may be lined with insulating sidewalls 150, upon whose exposed surfaces are formed non-crystalline polysilicon (not shown). An n-type doped non-crystalline polysilicon 140, which incorporates an n-type impurity, such as phosphorous (P), is deposited at 650° C., using a silicon-containing gas, such as silane (SiH$_4$), and a phosphorus-containing gas, such as phosphine (PH$_3$), within the emitter opening and over the insulating layer 160. Following deposition, the substrate is heated at 925°, causing phosphorus (P) from the n-type doped non-crystalline polysilicon 140 to diffuse into a central portion of the undoped crystalline silicon cap 130, forming the n-type diffusion-doped crystalline emitter of the HBT. Subsequently, the n-type doped non-crystalline polysilicon 140 is annealed, patterned and etched to define T-shaped emitter lead electrode 140.

By the processes described above, an npn-type Si/Si$_{1-x}$Ge$_x$ heterojunction bipolar transistor (HBT) 100 is provided, in which the n-type diffusion-doped emitter 130 is made of single crystal silicon, the p-type internal base 120 is mainly made of a Si$_{1-x}$Ge$_x$ crystal, and the n-type doped collector is made of single crystal silicon. It should be noted, however, that the emitter/base/collector junctions are partitioned from one another, not by the boundaries of the Si/SiGe crystals, but by the concentration profiles of the doping impurities.

An important goal of integrated semiconductor circuit manufacturing is to reduce the size and scale of electronic devices to increase speed, reduce power and decrease cost. As device scaling approaches the 130 nm node technology and beyond, alignment issues complicate the methods of semiconductor integration.

There remains a need to develop processes and structures for a heterojunction bipolar transistor (HBT) that uses existing semiconductor manufacturing processes to improve vertical scaling for HBTs of 130 nm node technology and beyond.

SUMMARY

An exemplary embodiment may provide an n-type doped crystalline collector of a heterojunction bipolar transistor (HBT) that is disposed in an upper portion of a crystalline silicon substrate layer. A p-type doped crystalline p$^+$Si$_{1-x}$Ge$_x$ layer may be disposed above the n-type doped collector to form a p-type doped internal base of the HBT. A crystalline silicon cap may be disposed on the p-type doped crystalline p$^+$Si$_{1-x}$Ge$_x$ layer, where the crystalline silicon cap may include an n-type impurity to form an n-type doped emitter of the HBT. An n-type doped crystalline silicon emitter stack may be disposed within an opening, which is formed down through an insulating layer to an upper surface of the crystalline silicon cap. The n-type doped crystalline silicon emitter stack may have an upper surface that is lower than or equal to an upper surface of the insulating layer.

Another exemplary embodiment may provide an n-type doped crystalline collector of a heterojunction bipolar transistor (HBT) that is disposed in an upper portion of a crystalline silicon substrate layer centered between a pair of device-isolating shallow trench isolators. An undoped crystalline i-Si$_{1-x}$Ge$_x$ layer may be formed on an upper surface of the crystalline silicon substrate layer. A p-type doped crystalline p$^+$Si$_{1-x}$Ge$_x$ layer may be disposed above the n-type doped collector, where a central portion of the p-type doped crystalline p$^+$Si$_{1-x}$Ge$_x$ layer may form a p-type doped internal base of the HBT. A crystalline silicon cap may be disposed on the p-type doped crystalline p$^+$Si$_{1-x}$Ge$_x$ layer, where a central portion of the crystalline silicon cap may include an n-type impurity to form an n-type doped emitter of the HBT. The p-type doped crystalline p$^+$Si$_{1-x}$Ge$_x$ layer and the crystalline silicon cap may form a heterojunction between the n-type doped emitter and the p-type doped internal base of the HBT. An n-type doped crystalline silicon emitter stack may be disposed within an opening, centered above the n-type doped emitter and penetrating through an insulating layer and an external base layer to an upper surface of the crystalline silicon cap. The n-type doped crystalline silicon emitter stack may have an upper surface that is lower than or equal to an upper surface of the insulating layer.

Yet another exemplary embodiment may provide a method of epitaxially growing a crystalline silicon cap on a p-type doped crystalline $p^+Si_{1-x}Ge_x$ layer of a heterojunction bipolar transistor (HBT). The method may include forming an opening through an insulating layer and an external base layer, which overlie the crystalline silicon cap, to a central portion of an upper surface of the crystalline silicon cap. The method may further include epitaxially growing an n-type doped crystalline silicon emitter stack within the opening by using at least an n-type doped disilane ($Si_2H_6$) epitaxial growth, at a temperature of less than 600° C., to form an n-type doped emitter by diffusion of the n-type dopant from the n-type doped crystalline silicon emitter stack into the crystalline silicon cap. The crystalline silicon cap including the n-type doped emitter and the p-type doped crystalline $p^+Si_{1-x}Ge_x$ layer including a p-type doped internal base, may form a heterojunction of the HBT.

BRIEF DESCRIPTION OF THE DRAWINGS

The embodiments herein will be better understood from the following detailed description with reference to the drawings, which are not necessarily drawing to scale and in which:

FIG. 3 is a schematic diagram illustrating a cross-sectional view of a substrate upon which an emitter stack may be formed in an exemplary embodiment;

DETAILED DESCRIPTION

Figure 1:
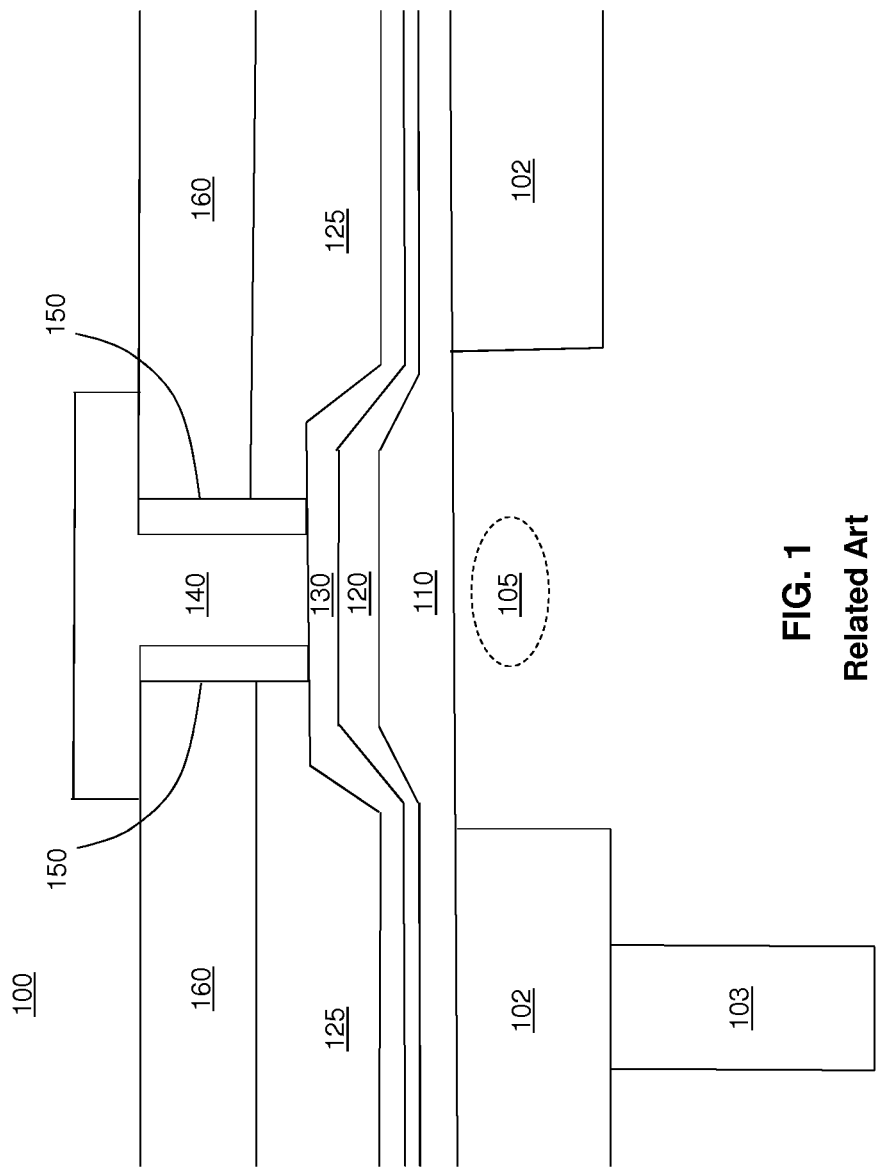
FIG. 1 is a schematic diagram illustrating a cross-sectional view of a conventional heterojunction bipolar transistor (HBT) in the related art.

The exemplary embodiments of the invention and the various features and advantageous details thereof are explained more fully with reference to the non-limiting exemplary embodiments that are illustrated in the accompanying drawings and detailed in the following description. It should be noted that the features illustrated in the drawings are not necessarily drawn to scale. Descriptions of well-known materials, components, and processing techniques are omitted so as to not unnecessarily obscure the exemplary embodiments of the invention. The examples used herein are intended to merely facilitate an understanding of ways in which the exemplary embodiments of the invention may be practiced and to further enable those of skill in the art to practice the exemplary embodiments of the invention. Accordingly, the examples should not be construed as limiting the scope of the exemplary embodiments of the invention.

As described above, there remains a need to develop processes and structures for a heterojunction bipolar transistor (HBT) that uses existing semiconductor manufacturing processes to improve vertical scaling for HBTs of 130 nm node technology and beyond.

Figure 2:
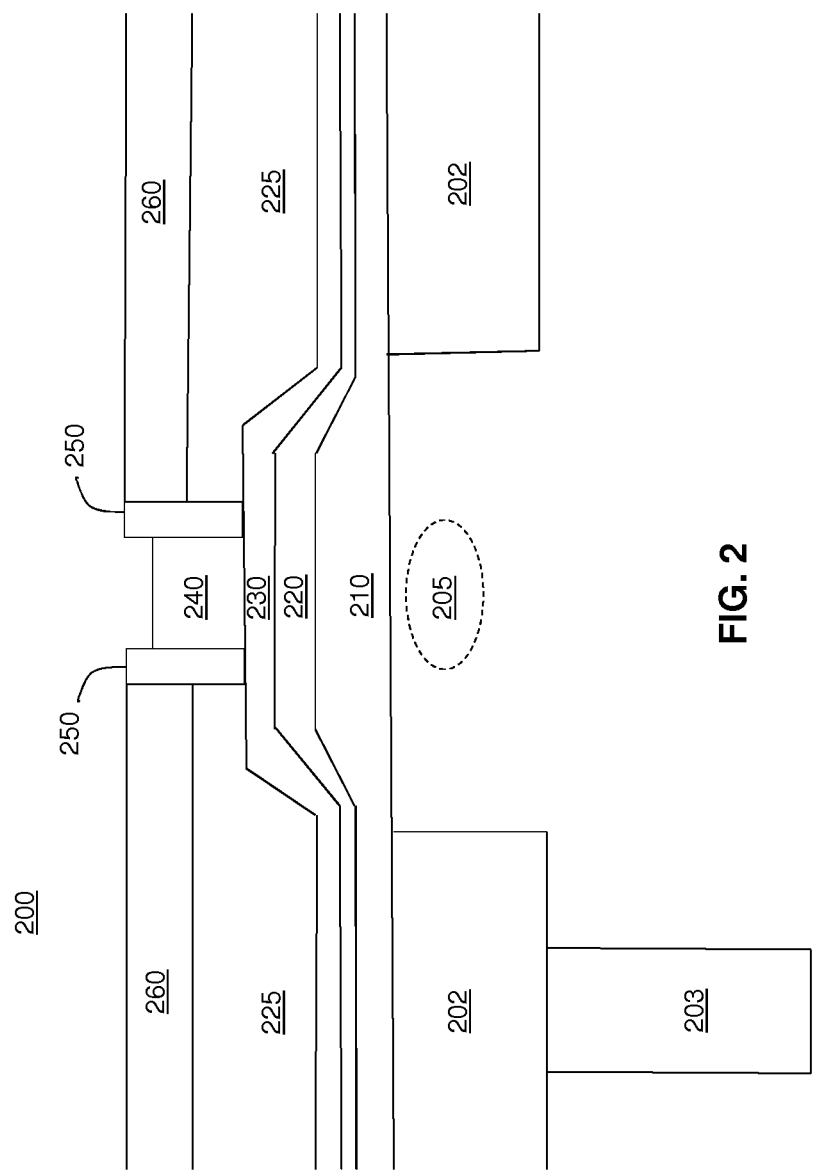
FIG. 2 is a schematic diagram illustrating a cross-sectional view of an HBT with an epitaxially grown crystalline emitter stack in an exemplary embodiment.

FIG. 2 illustrates a cross-sectional view of an exemplary embodiment of an npn-type HBT 200 including: a centrally disposed n-type doped collector 205 made of a single silicon crystal; an undoped crystalline $i-Si_{1-x}Ge_x$ layer 210 that overlies the n-type doped collector 205; a p-type doped crystalline $p^+Si_{1-x}Ge_x$ layer 220 that overlies the undoped crystalline $i-Si_{1-x}Ge_x$ layer 210, a central portion of the p-type doped crystalline $p^+Si_{1-x}Ge_x$ layer 220 mainly forming an internal base; and a crystalline silicon cap 230 that overlies the p-type doped crystalline $p^+Si_{1-x}Ge_x$ layer 220, a central portion of the crystalline silicon cap 230 containing an n-type impurity, which has diffused from an overlying n-type doped crystalline emitter stack 240, to form an n-type doped crystalline emitter.

The n-type doped collector 205 may be disposed within an upper portion of a crystalline silicon substrate layer located between device-isolating shallow trench isolators 202 and a deep trench 203. The crystalline silicon substrate layer may be grown epitaxially and an n-type impurity, for example, one of phosphorus (P) and arsenic (As), may be introduced into the upper portion of the crystalline silicon substrate layer during epitaxial growth or by ion implantation to form the n-type doped collector 205.

The undoped $i-Si_{1-x}Ge_x$ layer 210 may be epitaxially grown on the crystalline silicon substrate layer, which contains the n-type doped collector 205, by the admixture of a silicon-containing gas, such as silane ($SiH_4$) or disilane ($Si_2H_6$), and a germanium-containing gas, such as germane ($GeH_4$) or digermane ($Ge_2H_6$), respectively.

The p-type doped $p^+Si_{1-x}Ge_x$ layer 220 may be epitaxially grown on the undoped $i-Si_{1-x}Ge_x$ layer 210 by the deposition of gases including: a gas containing a p-type impurity, such as, borane ($B_2H_6$), or another boron (B)-containing gas; a silicon (Si)-containing gas, such as, one of silane ($SiH_4$) and disilane ($Si_2H_6$); and a germanium (Ge)-containing gas, such as, one of germane ($GeH_4$) and digermane ($Ge_2H_6$).

The crystalline silicon cap 230 may be epitaxially grown on the p-type doped $p^+Si_{1-x}Ge_x$ layer 220 by the admixture of a silicon-containing gas, such as silane ($SiH_4$) or disilane ($Si_2H_6$), and a germanium-containing gas, such as germane ($GeH_4$) or digermane ($Ge_2H_6$). The crystalline silicon cap 230 may include the same n-type impurity, for example, one of phosphorus (P) and arsenic (As), as found in the n-type doped crystalline emitter 205. The n-type impurity, included in a central portion of the crystalline silicon cap 230, may result from the out-diffusion of the n-type impurity from the formation of an overlying n-type doped crystalline emitter stack 240.

In an exemplary embodiment, the n-type doped crystalline emitter stack 240 may be self-aligned between sidewalls 250 of the emitter opening and over a central portion of the crystalline silicon cap 230. The n-type doped crystalline emitter stack 240 may partially or entirely fill the emitter opening bounded by sidewalls 250. The sidewalls 250, formed on the emitter opening, may comprise an appropriate and process-compatible dielectric, for example, silicon nitride ($Si_3N_4$) or any of the silicon oxides. The n-type doped crystalline emitter stack 240 may comprise one of: a single layer, two layers, and three layers of epitaxially-grown n-type doped silicon crystalline materials in various exemplary embodiments. For example, the n-type doped crystalline emitter stack 240 may comprise: a single layer of any of SiP, SiCP, and SiGeP; two layers of any of SiCP and SiP, SiP and SiGeP, and SiCP and SiGeP; and three layers of SiCP, SiP, and SiGeP. Alternatively, the n-type doped crystalline emitter stack 240 may comprise: a single layer of any of SiAs, SiCAs, and SiGeAs; two layers of any of SiCAs and SiAs, SiAs and SiGeAs, and SiCAs and SiGeAs; and three layers of SiCAs, SiAs, and SiGeAs.

Referring to FIG. 2, the vertical scaling of the npn-type HBT 200 is decreased, when compared to the conventional npn-type, SiGe HBT 100 of FIG. 1, because the T-shaped emitter lead electrode 140, having its cross-bar formed on the insulating layer 260, is not present in the exemplary embodiment. Instead, the n-type doped crystalline emitter stack 240 of an exemplary embodiment fills the emitter opening, through the insulating layer 260 and the external base layer 225, to a level below or equal to that of an upper surface of the insulating layer 260. The insulating layer 260 may comprise any of the silicon oxides.

FIG. 3 illustrates a cross-sectional view of a substrate of an npn-type HBT, upon which the n-type doped crystalline emitter stack 240 of FIG. 2 has not yet been formed, in an exemplary embodiment of making the npn-type HBT with an epitaxial emitter stack. The heterojunction substrate includes: a centrally disposed n-type doped collector 305 made of a single silicon crystal; an undoped crystalline i-$Si_{1-x}Ge_x$ layer 310 that overlies the n-type doped collector 305; a p-type doped crystalline $p^+Si_{1-x}Ge_x$ layer 320 that overlies the undoped crystalline i-$Si_{1-x}Ge_x$ layer 310, a central portion of the p-type doped crystalline $p^+Si_{1-x}Ge_x$ layer 320 mainly forming an internal base; a crystalline silicon cap 330 that overlies the p-type doped crystalline $p^+Si_{1-x}Ge_x$ layer 320, a central portion of the crystalline silicon cap 330 containing an n-type impurity. The heterojunction substrate also includes an external base layer 325 and an insulating layer 360 that are formed, respectively, over the undoped Si cap layer 330. The heterojunction substrate further includes an emitter opening 370 that is formed through the external base layer 325 and the insulating layer 360, to an upper surface of a central portion of the crystalline silicon cap 330, which overlies the n-type doped collector 305. Sidewalls 350 may comprise an appropriate and process-compatible dielectric, for example, silicon nitride ($Si_3N_4$) or any of the silicon oxides, and may be formed on the walls of the emitter opening 370.

Referring to FIG. 3, the heterojunction substrate may include a Si/$Si_{1-x}Ge_x$ heterojunction including the crystalline silicon cap 330, and the p-type doped and undoped $Si_{1-x}Ge_x$ layers 320, 310, respectively. The n-type doped collector 305 may be formed within an upper portion of a crystalline silicon substrate layer disposed between device-isolating shallow trench isolators 302 and a deep trench 303. The crystalline silicon substrate layer may be grown epitaxially and an n-type impurity, for example, one of phosphorus (P) and arsenic (As), may be introduced into the upper portion of the crystalline silicon substrate layer during epitaxial growth or by ion implantation to form the n-type collector.

Epitaxial growth of the p-type impurity doped $p^+Si_{1-x}Ge_x$ layer 320 may occur by mixing gases including: a gas containing a p-type impurity, such as borane ($B_2H_6$) or another boron (B)-containing gas; a silicon (Si)-containing gas, for example, one of silane ($SiH_4$) and disilane ($Si_2H_6$); and a germanium (Ge)-containing gas, for example, one of germane ($GeH_4$) and digermane ($Ge_2H_6$). The p-type doped $p^+Si_{1-x}Ge_x$ layer 320, which mainly forms an internal base, may be electrically connected to the external base layer 325.

The crystalline silicon cap 330 may be epitaxially grown on the p-type doped $p^+Si_{1-x}Ge_x$ layer 320 by the admixture of a silicon-containing gas, such as silane ($SiH_4$) or disilane ($Si_2H_6$), and a germanium-containing gas, such as germane ($GeH_4$) or digermane ($Ge_2H_6$).

Figure 4A:
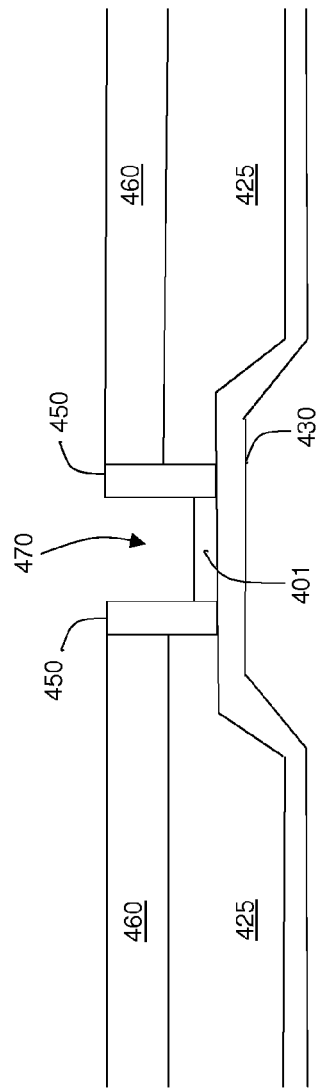
FIG. 4A is a schematic diagram illustrating a cross-sectional view of a heterojunction bipolar transistor with a first layer of a crystalline emitter stack in the exemplary embodiment.

FIG. 4A illustrates a cross-sectional view of a heterojunction substrate of an npn-type HBT in an exemplary embodiment of making the npn-type HBT with an n-type doped crystalline emitter stack of a single layer. A self-aligned first emitter stack layer 401 may be formed within the emitter opening 470, between the sidewalls 450, and on a central portion of an upper surface of the crystalline silicon cap 430. The sidewalls 450 may comprise an appropriate and process-compatible dielectric, for example, silicon nitride ($Si_3N_4$) or any of the silicon oxides, and may be formed on the walls of the emitter opening 470. An upper surface of the first emitter stack layer 401 may be lower than or equal to that of an upper surface of the insulating layer 460.

The first emitter stack layer 401 may be epitaxially grown using disilane ($Si_2H_6$) gas and phosphine gas ($PH_3$) at a temperature of 600° C. or less, to deposit crystalline SiP in an exemplary embodiment. In various exemplary embodiments, one of: a carbon-containing gas and a germanium-containing gas, for example, methylsilane and one of germane gas ($GeH_4$) and digermane gas ($Ge_2H_6$), may be added to the disilane and phosphine gases to deposit, respectively, crystalline SiCP and crystalline SiGeP, at a temperature of 600° C. or less, for the first emitter stack layer 401. The admixture of various concentrations of the gases during the deposition of the first emitter stack layer 401 may control concentration profiles of phosphorus (P), carbon (C), and germanium (Ge) within the first emitter stack layer 401.

When compared to the higher temperatures, i.e., greater than or equal to 650° C., for deposition of a conventional n-type doped non-crystalline polysilicon emitter lead electrode, which uses a silane ($SiH_4$) process, and the subsequent required annealing at a temperature of 950° C., the lower temperature of epitaxial growth afforded by the disilane process and absence of annealing in the exemplary embodiment may reduce the out diffusion of phosphorus (P) from the first emitter stack layer 401 to the underlying crystalline silicon cap 430, in which the n-type doped crystalline emitter of the HBT is formed, yielding a hyper-abrupt concentration change, a nearly fully activated n-type doping, and a n-type doped crystalline emitter of low resistivity—all of which facilitate high frequency operation of the heterojunction bipolar transistor (HBT) in the exemplary embodiment.

Furthermore, when crystalline SiCP is deposited using disilane, the added carbon may produce an undersaturation of Si self-interstitials that also suppresses out diffusion of phosphorus from the first emitter stack layer 401 to the underlying crystalline silicon cap 430, in which the n-type doped crystalline emitter of the HBT is formed in an exemplary embodiment.

Figure 4B:
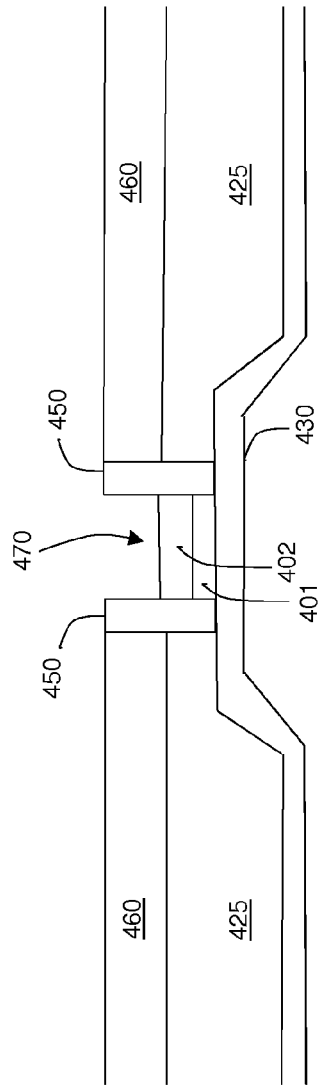
FIG. 4B is a schematic diagram illustrating of a heterojunction bipolar transistor with first and second layers of a crystalline emitter stack in the exemplary embodiment.

FIG. 4B illustrates a cross-sectional view of a heterojunction substrate of an npn-type HBT in an exemplary embodiment of making the npn-type HBT with an n-type doped crystalline emitter stack of two layers. A second emitter stack layer 402 may be formed within the emitter opening 470 between the sidewalls 450 and on an upper surface of the first emitter stack layer 401. The second emitter stack layer 402 differs in composition from that of the first emitter stack layer 401. Before forming the second emitter stack layer 402, an etch of the upper surface of the first emitter stack layer 401 may occur. An upper surface of the second emitter stack layer 402 may be lower than or equal to that of an upper surface of the insulating layer 460. The second emitter stack layer 402 may be epitaxially grown using at least disilane ($Si_2H_6$) gas and phosphine gas ($PH_3$) at a temperature of 600° C. or less, to deposit a crystal containing at least silicon and phosphorus. In various exemplary embodiments, one of: a carbon-containing gas and a germanium-containing gas, for example, methylsilane, and one of germane gas ($GeH_4$) and digermane gas ($Ge_2H_6$), may be added to the disilane and phosphine gases to deposit, respectively, crystalline SiCP and crystalline SiGeP for the second emitter stack layer 402. The admixture of various concentrations of the gases during the deposition of the second emitter stack layer 402 may control concentration profiles of phosphorus (P), carbon (C), and germanium (Ge) within the second emitter stack layer 402.

An upper surface of a second emitter stack layer 402 comprising SiP may provide a good substrate for subsequent silicidation, particularly, when the concentration profile of phosphorus (P) provides a lower concentration of phosphorus (P) adjacent to the upper surface.

Figure 4C:
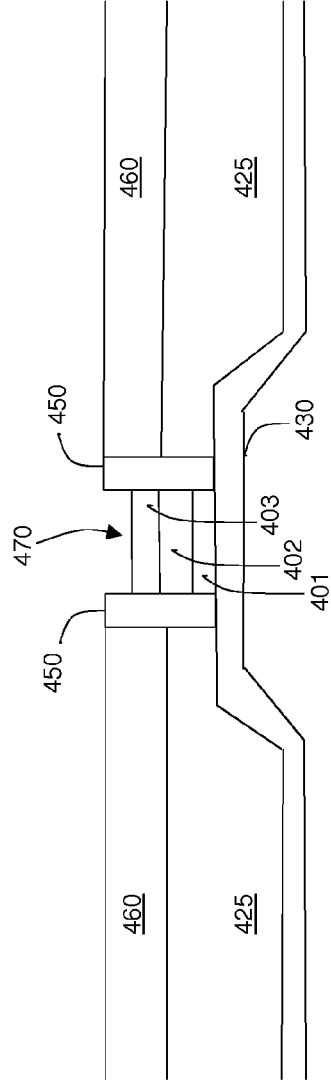
FIG. 4C is a schematic diagram illustrating of a heterojunction bipolar transistor with first, second and third layers of a crystalline emitter stack in the exemplary embodiment.

Referring to FIG. 4C, a third emitter stack layer 403 may be formed within the emitter opening 470 between the sidewalls 450 and on an upper surface of the second emitter stack layer 402. The third emitter stack layer 403 differs in composition from that of the first emitter stack layer 401 and the second emitter stack layer 402. Before forming the third emitter stack layer 403, an etch of the upper surface of the second emitter stack layer 402 may occur. An upper surface of the third emitter stack layer 403 may be lower than or equal to that of an upper surface of the insulating layer 460. The third emitter stack layer 403 may be epitaxially grown using disilane ($Si_2H_6$) gas and phosphine gas ($PH_3$) at a temperature of 600° C. or less, to deposit crystalline SiP. In various exemplary embodiments, one of: a carbon (C)-containing gas and a germanium-containing gas, for example, methylsilane, and one of germane gas ($GeH_4$) and digermane gas ($Ge_2H_6$), may be added to the disilane and phosphine gases to deposit, respectively, crystalline SiCP and crystalline SiGeP for the third emitter stack layer 403. The admixture of various concentrations of the gases during the deposition of the third emitter stack layer 403 may control concentration profiles of phosphorus (P), carbon (C), and germanium (Ge) within the third emitter stack layer 403.

An upper surface of a third emitter stack layer 403 comprising SiP may provide a good substrate for subsequent silicidation, particularly, when the concentration profile of phosphorus (P) provides a lower concentration of phosphorus (P) adjacent to the upper surface.

Thus, as described above, formation of a self-aligned n-type doped crystalline emitter stack, including one of: a first emitter stack layer 401; a first emitter stack layer 401 and a second emitter stack layer 402; and a first emitter stack layer 401, a second emitter stack layer 402, and a third emitter stack layer 403, may provide an n-type doped crystalline emitter stack disposed over a central portion of the crystalline silicon cap 430, which forms an n-type doped crystalline emitter by out diffusion of the n-type impurity from the overlying n-type doped crystalline emitter stack. In various exemplary embodiments, an HBT with a self-aligned n-type doped crystalline emitter stack provides nearly fully activated n-type doping and low resistivity of the emitter, which facilitate high frequency operation of the heterojunction bipolar transistor (HBT), good silicidation on an upper surface of the emitter stack, and an n-type doped crystalline emitter stack with decreased vertical scaling, when compared to the conventional npn type, SiGe HBT suing a polysilicon T-shaped emitter lead.

Photomicrographs of prototype epitaxially-grown emitter stacks, using a disilane process and being disposed between silicon nitride ($Si_3N_4$) sidewalls formed on 22 nm node technology epitaxial silicon-on-insulator (SOI) devices, indicate that the upper surface of the epitaxially-grown emitter stack is substantially flat. Thus, these shallow facets, i.e., interfaces between crystalline SiGe and poly-crystalline SiGe, may be used to form structures on the upper surface of the crystalline emitter stack.

Figure 5:
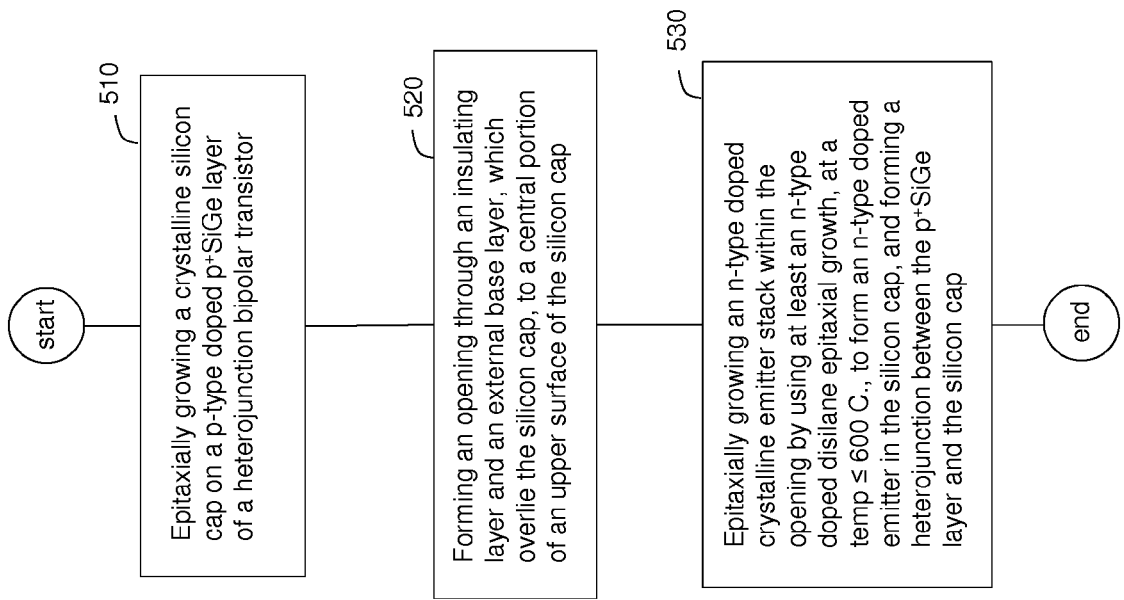
FIG. 5 is a flow chart illustrating a method for making an HBT with a crystalline emitter stack in an exemplary embodiment.

FIG. 5 illustrates a flow chart 500 for an exemplary embodiment for making an npn-type, SiGe heterojunction bipolar transistor (HBT) with an n-type doped crystalline emitter stack. Initially, a crystalline silicon cap may be epitaxially grown on a p-type doped crystalline $p^+Si_{1-x}Ge_x$ layer of a heterojunction bipolar transistor (HBT) 510. An opening may be formed through an insulating layer and an external base layer, which overlie the crystalline silicon cap, to a central portion of an upper surface of the crystalline silicon cap 520. An n-type doped crystalline silicon emitter stack may be epitaxially grown within the opening by using at least an n-type doped disilane ($Si_2H_6$) epitaxial growth, at a temperature of less than 600° C., that forms an n-type doped emitter by diffusion of the n-type dopant from the n-type doped crystalline silicon emitter stack into the crystalline silicon cap, where the crystalline silicon cap including the n-type doped emitter and the p-type doped crystalline $p^+Si_{1-x}Ge_x$ including a p-type doped internal base, forming a heterojunction of the HBT 530.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For purposes herein, a "semiconductor" is a material or element that may include an implanted impurity that allows the material to sometimes be a conductor and sometimes be an insulator, based on electron and hole carrier concentration. For purposes herein, a "dielectric" is a relative term that means a material or element that allows substantially less (<95%) electrical current to flow than does a "conductor." The dielectrics (insulators) mentioned herein can, for example, be grown from either dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance. The conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist) can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the embodiments herein have been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiment was chosen and described in order to best explain the principles of the embodiments and the practical application, and to enable others of ordinary skill in the art to understand the embodiments for various embodiments with various modifications as are suited to the particular use contemplated.

What is claimed is:

1. A device comprising:
   a crystalline silicon substrate layer of a heterojunction bipolar transistor (HBT);
   an n-type doped crystalline collector of said HBT in an upper portion of said crystalline silicon substrate layer;
   a p-type doped crystalline layer above said n-type doped crystalline collector, said p-type doped crystalline layer comprising a p-type doped internal base of said HBT;
   a crystalline silicon cap on said p-type doped crystalline layer, said crystalline silicon cap including an n-type impurity and comprising an n-type doped emitter of said HBT;
   an external base layer and an insulating layer on said crystalline silicon cap, said external base layer and said insulating layer having an opening extending down to an upper surface of said crystalline silicon cap;
   insulating sidewalls disposed on said opening; and
   an n-type doped crystalline silicon emitter stack within said insulating sidewalls of said opening, said n-type doped crystalline silicon emitter stack having an upper surface that is lower than or equal to an upper surface of said insulating layer and a lower surface that is co-planar with said upper surface of said crystalline silicon cap and a lower surface of said insulating sidewalls.

2. The device of claim 1, further comprising an undoped crystalline i-$Si_{1-x}Ge_x$ layer between said crystalline silicon substrate layer and said p-type doped crystalline layer.

3. The device of claim 1, said n-type doped crystalline silicon emitter stack being above a central portion of said crystalline silicon cap that forms said n-type doped emitter, a central portion of said p-type doped crystalline layer that forms said p-type doped internal base, and said n-type doped collector in said upper portion of said crystalline silicon substrate layer.

4. The device of claim 1, said n-type doped crystalline collector and said n-type doped crystalline emitter stack including an n-type impurity comprising one of: phosphorus (P) and arsenic (As).

5. The device of claim 4, said n-type doped crystalline silicon emitter stack comprising one of: a first layer; a first layer and a second layer; and a first layer, a second layer, and a third layer.

6. The device of claim 5,
   said first layer comprising one of: SiP, SiCP, and SiGeP;
   said second layer comprising one of: SiP, SiCP, and SiGeP, said second layer differing in composition from said first layer; and
   said third layer comprising one of: SiP, SiCP, and SiGeP, said third layer differing in composition from said first layer and said second layer.

7. The device of claim 5,
   said first layer comprising one of: SiAs, SiCAs, and SiGeAs;
   said second layer comprising one of: SiAs, SiCAs, and SiGeAs, said second layer differing in composition from said first layer; and
   said third layer comprising one of: SiAs, SiCAs, and SiGeAs, said third layer differing in composition from said first layer and said second layer.

8. The device of claim 5, said upper surface of said emitter stack being substantially flat.

9. A device comprising:
   a crystalline silicon substrate layer of a heterojunction bipolar transistor (HBT);
   a pair of device-isolating shallow trench isolators, said crystalline silicon substrate layer being centered between said pair of device-isolating shallow trench isolators;
   an n-type doped crystalline collector of said HBT in an upper portion of said crystalline silicon substrate layer;
   an undoped crystalline i-$Si_{1-x}Ge_x$ layer formed on an upper surface of said crystalline silicon substrate layer;
   a p-type doped crystalline p$^+$$Si_{1-x}Ge_x$ layer above said n-type doped collector, a central portion of said p-type doped crystalline p$^+$$Si_{1-x}Ge_x$ layer comprising a p-type doped internal base of said HBT;
   a crystalline silicon cap on said p-type doped crystalline p$^+$$Si_{1-x}Ge_x$ layer, a central portion of said crystalline silicon cap including an n-type impurity and comprising an n-type doped emitter of said HBT, said p-type doped crystalline p$^+$$Si_{1-x}Ge_x$ layer and said crystalline silicon cap comprising a heterojunction between said n-type doped emitter and said p-type doped internal base of said HBT;
   an external base layer and an insulating layer on said crystalline silicon cap, said external base layer and said insulating layer having an opening extending down to an upper surface of said crystalline silicon cap;
   insulating sidewalls disposed on said opening; and an n-type doped crystalline silicon emitter stack within said insulating sidewalls of said opening and being centered above said n-type doped emitter, said n-type doped crystalline silicon emitter stack having an upper surface that is lower than or equal to an upper surface of said insulating layer and a lower surface that is co-planar with said upper surface of said crystalline silicon cap and a lower surface of said insulating layer.

10. The device of claim 9, said n-type doped collector and said n-type doped crystalline emitter stack including an n-type impurity comprising one of: phosphorus (P) and arsenic (As).

11. The device of claim 9, said n-type doped crystalline silicon emitter stack comprising one of: a first layer; a first layer and a second layer; and a first layer, a second layer, and a third layer.

12. The device of claim 11,
said first layer comprising one of: SiP, SiCP, and SiGeP;
said second layer comprising one of: SiP, SiCP, and SiGeP, said second layer differing in composition from said first layer; and
said third layer comprising one of: SiP, SiCP, and SiGeP, said third layer differing in composition from said first layer and said second layer.

13. The device of claim 11,
said first layer comprising one of: SiAs, SiCAs, and SiGeAs;
said second layer comprising one of: SiAs, SiCAs, and SiGeAs, said second layer differing in composition from said first layer; and
said third layer comprising one of: SiAs, SiCAs, and SiGeAs, said third layer differing in composition from said first layer and said second layer.

14. A device comprising:
a crystalline silicon substrate layer of a heterojunction bipolar transistor (HBT);
an n-type doped crystalline collector of said HBT in an upper portion of said crystalline silicon substrate layer;
an undoped crystalline i-$Si_{1-x}Ge_x$ layer formed on an upper surface of said crystalline silicon substrate layer;
a p-type doped crystalline $p^+Si_{1-x}Ge_x$ layer above said n-type doped collector, a central portion of said p-type doped crystalline $p^+Si_{1-x}Ge_x$ layer comprising a p-type doped internal base of said HBT;
a crystalline silicon cap on said p-type doped crystalline $p^+Si_{1-x}Ge_x$ layer, a central portion of said crystalline silicon cap including an n-type impurity and comprising an n-type doped emitter of said HBT;
an external base layer and an insulating layer on said crystalline silicon cap, said external base layer and said insulating layer having an opening extending down to an upper surface of said crystalline silicon cap;
insulating sidewalls disposed on said opening; and
an n-type doped crystalline silicon emitter stack within said insulating sidewalls of said opening and being centered above said n-type doped emitter, said n-type doped crystalline silicon emitter stack having an upper surface that is lower than or equal to an upper surface of said insulating layer and a lower surface that is co-planar with said upper surface of said crystalline silicon cap and a lower surface of said insulating layer.

15. The device of claim 14, said n-type doped collector and said n-type doped crystalline emitter stack including an n-type impurity comprising one of: phosphorus (P) and arsenic (As).

16. The device of claim 14, said n-type doped crystalline silicon emitter stack comprising one of: a first layer; a first layer and a second layer; and a first layer, a second layer, and a third layer.

17. The device of claim 16,
said first layer comprising one of: SiP, SiCP, and SiGeP;
said second layer comprising one of: SiP, SiCP, and SiGeP, said second layer differing in composition from said first layer; and
said third layer comprising one of: SiP, SiCP, and SiGeP, said third layer differing in composition from said first layer and said second layer.

18. The device of claim 16,
said first layer comprising one of: SiAs, SiCAs, and SiGeAs;
said second layer comprising one of: SiAs, SiCAs, and SiGeAs, said second layer differing in composition from said first layer; and
said third layer comprising one of: SiAs, SiCAs, and SiGeAs, said third layer differing in composition from said first layer and said second layer.

* * * * *